(12) United States Patent
Liu et al.

(10) Patent No.: US 10,424,599 B2
(45) Date of Patent: Sep. 24, 2019

(54) SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Ji Quan Liu, Shanghai (CN); Chun Lei Gong, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/895,430

(22) Filed: Feb. 13, 2018

(65) Prior Publication Data
US 2018/0175068 A1 Jun. 21, 2018

Related U.S. Application Data

(62) Division of application No. 15/452,788, filed on Mar. 8, 2017, now Pat. No. 9,929,182.

(30) Foreign Application Priority Data

Mar. 9, 2016 (CN) .......................... 2016 1 0134339

(51) Int. Cl.
*H01L 27/01* (2006.01)
*H01L 31/0392* (2006.01)
*H01L 27/12* (2006.01)
*H01L 21/762* (2006.01)
*H01L 29/66* (2006.01)
*H01L 29/78* (2006.01)
(Continued)

(52) U.S. Cl.
CPC ........ *H01L 27/1207* (2013.01); *H01L 21/762* (2013.01); *H01L 21/7624* (2013.01); *H01L 21/76248* (2013.01); *H01L 21/823431* (2013.01); *H01L 21/845* (2013.01); *H01L 27/1211* (2013.01); *H01L 29/66795* (2013.01); *H01L 29/7851* (2013.01); *H01L 29/78603* (2013.01)

(58) Field of Classification Search
CPC ........... H01L 27/1207; H01L 29/66795; H01L 21/76224; H01L 29/78603
USPC ......................................................... 257/350
See application file for complete search history.

(56) References Cited

U.S. PATENT DOCUMENTS

2005/0153490 A1  7/2005  Yoon et al.
2012/0025316 A1* 2/2012  Schultz ................ H01L 21/845
                                                    257/368
(Continued)

*Primary Examiner* — Theresa T Doan
(74) *Attorney, Agent, or Firm* — Anova Law Group, PLLC

(57) ABSTRACT

Semiconductor structures are provided. A semiconductor structure includes a bottom substrate having a first region and a second region; an insulation layer formed on the bottom substrate in the first region; a top substrate on side surface of the trench and the insulation layer; a first fin portion formed over the insulation layer, and a gate structure crossing the first fin portion. The first fin portion is electrically isolated from the bottom substrate through the insulation layer to reduce the leakage current at the bottom of the first fin portion. The gate structure covers part of side and top surfaces of the first fin portion.

12 Claims, 8 Drawing Sheets

(51) Int. Cl.
*H01L 29/786* (2006.01)
*H01L 21/84* (2006.01)
*H01L 21/8234* (2006.01)

(56) References Cited

U.S. PATENT DOCUMENTS

| | | |
|---|---|---|
| 2013/0020640 A1 | 1/2013 | Chen et al. |
| 2013/0217204 A1 | 8/2013 | Park |
| 2014/0027863 A1* | 1/2014 | Adam ............ H01L 29/16 257/410 |
| 2014/0302645 A1 | 10/2014 | Rodder et al. |
| 2014/0346612 A1 | 11/2014 | Adam et al. |

* cited by examiner

SEMICONDUCTOR STRUCTURE

CROSS-REFERENCES TO RELATED APPLICATIONS

This application is a divisional of U.S. patent application Ser. No. 15/452,788, filed on Mar. 8, 2017, which claims the priority of Chinese patent application No. 201610134339.X, filed on Mar. 9, 2016, the entirety of all of which is incorporated herein by reference.

FIELD OF THE INVENTION

The present invention generally relates to the field of semiconductor manufacturing technology and, more particularly, relates to a semiconductor structure.

BACKGROUND

With the rapid development of semiconductor manufacturing technology, the semiconductor device is progressing towards higher component density and higher integration degree. With the increasing of the component density and the integration degree of the semiconductor device, gate dimensions of planar transistor are scaled down, reducing effective length of the gate. As such, the ratio of charges in the depletion layer actually controlled by the gate voltage decreases, and the control capability of the gate-to-channel current becomes weak, leading to a short-channel effect and causing a leakage current issue, thus affecting the electrical properties of the semiconductor device.

A fin field effect transistor (FET) formed on a silicon-on-insulator (SOI) substrate can decrease the parasitic capacitance and reduce the leakage current. However, the FinFET formed on the SOI substrate has a disadvantage of high manufacturing cost. The FinFET formed on a bulk silicon substrate (bulk-FinFET) has many advantages, such as low cost, desired heat dissipation performance, and compatible with planar transistor device. However, the bulk-FinFET has a disadvantage of the large leakage current. The disclosed semiconductor structures and methods are directed to solve one or more problems set forth above and other problems.

BRIEF SUMMARY OF THE DISCLOSURE

One aspect of the present disclosure includes a method for fabricating a semiconductor structure. The method includes providing a bottom substrate having a first region and a second region, and forming a trench in the first region by patterning the bottom substrate. The method also includes forming an insulation layer in the trench in the first region, wherein the insulation layer exposes part of side surface of the trench, and forming a top substrate on the exposed side surface of the trench and the insulation layer. Further, the method includes forming a first fin portion in the first region, and forming a gate structure crossing the first fin portion, wherein the gate structure covers part of side and top surfaces of the first fin portion.

Another aspect of the present disclosure includes a semiconductor structure. The semiconductor structure includes a substrate having a first region and a second region. The semiconductor structure also includes an insulation layer formed on the substrate in the first region and a first fin portion formed on the insulation layer, wherein the first fin portion is electrically isolated from the substrate through the insulation layer to reduce the leakage current at the bottom of the first fin portion. Further, the semiconductor structure includes a gate structure crossing the first fin portion, wherein the gate structure covers part of side and top surfaces of the first fin portion.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

There are many issues in the semiconductor structure formed by existing techniques, such as the large transistor leakage current. FIGS. 1-5 illustrate semiconductor structures corresponding to certain stages of an existing fabrication process of a semiconductor structure.

Figure 1:
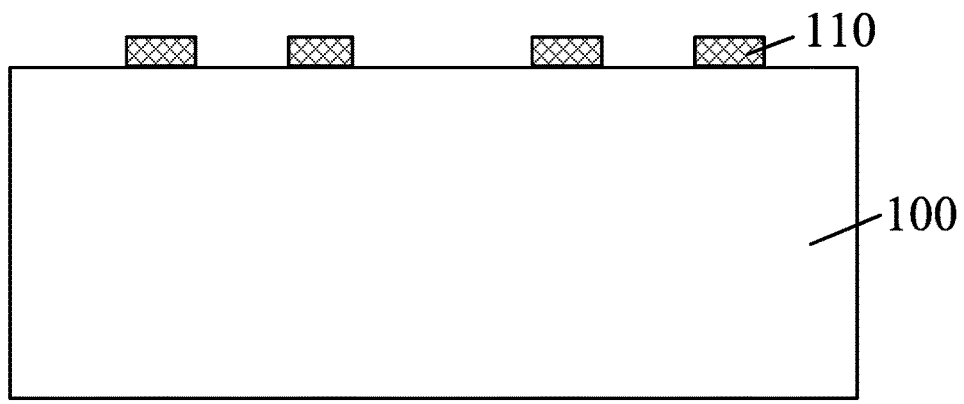
FIGS. 1-5 illustrate semiconductor structures corresponding to certain stages of an existing fabrication process of a semiconductor structure.
Figure 2:
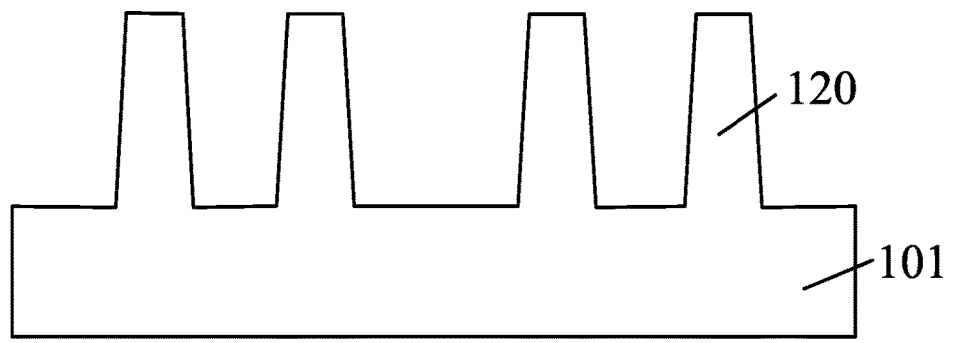
Figure 3:
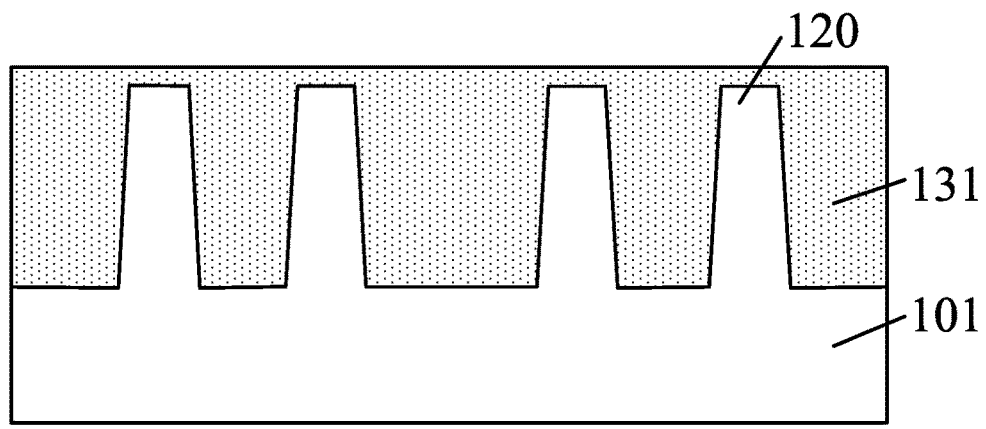
Figure 4:
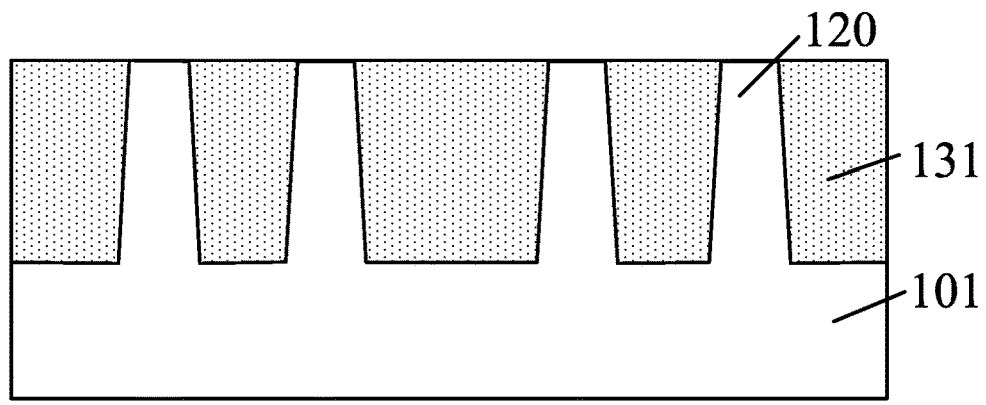
Figure 5:
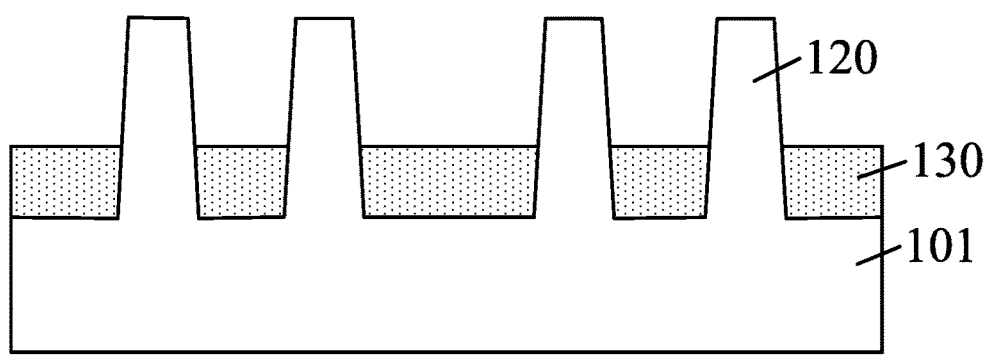

As shown in FIG. 1, the process of forming the semiconductor structure includes providing a substrate 100; and forming a mask layer 110 on the substrate 100. As shown in FIG. 2, the process also includes using the mask layer 110 (shown in FIG. 1) as a mask to pattern the substrate 100 to form a fin portion 120 and a base 101 contacted with the fin portion 120. In addition, as shown in FIG. 3, the process includes forming an isolation material layer 131 covering the fin portion 120. Moreover, as shown in FIG. 4, the process includes planarizing the isolation material layer 131. Further, as shown in FIG. 5, the process includes etching the isolation material layer 131 (shown in FIG. 4) until part of side wall of the fin portion 120 is exposed, to form an isolation structure 130; and forming a gate structure 140 crossing the fin portion 120, where the gate structure 140 covers part of top and side surfaces of the fin portion 120 (not labeled).

Referring to FIG. 1 and FIG. 2, the fin portion 120 is formed by patterning the substrate 100, where the fin portion 120 is directly contacted with the base 101. Both the fin portion 120 and the base 101 may be made of conductive materials. Therefore, after forming the transistor, carriers in the fin portion 120 may easily diffuse into the base 101, causing a large leakage current at the bottom of the fin portion 120.

To reduce the leakage current at the bottom of the fin portion 120, the substrate 100 may also be a silicon-on-insulator (SOI) substrate. Specifically, the SOI substrate may include a backing substrate, a buried oxide layer formed on the backing substrate, and a top silicon layer formed on the buried oxide layer. However, the process of forming the SOI substrate may be difficult and high-cost.

Figure 15:
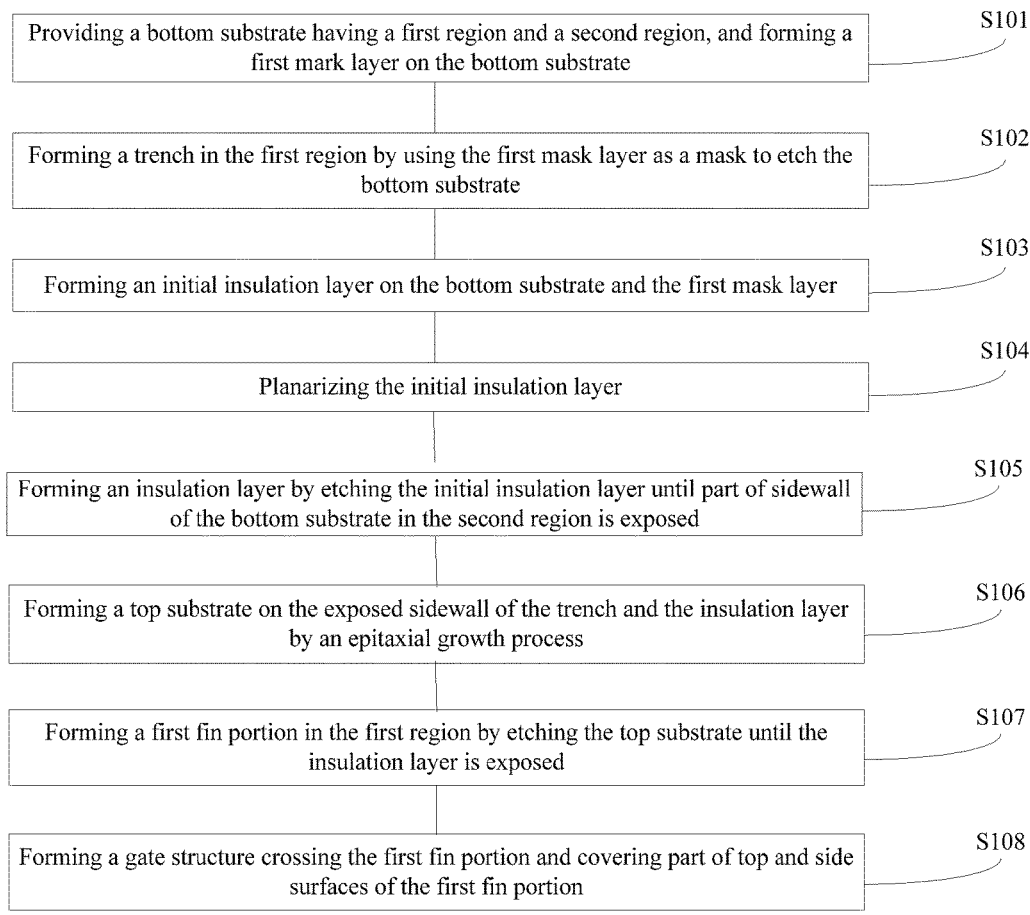
FIG. 15 illustrates an exemplary fabrication process to form a semiconductor structure consistent with the disclosed embodiments.

The present disclosure provides an improved semiconductor structure and fabrication process. FIG. 15 illustrates an exemplary fabrication process to form a semiconductor structure consistent with the disclosed embodiments; and FIGS. 6-13 illustrate semiconductor structures corresponding to certain stages of the exemplary fabrication process.

Figure 6:
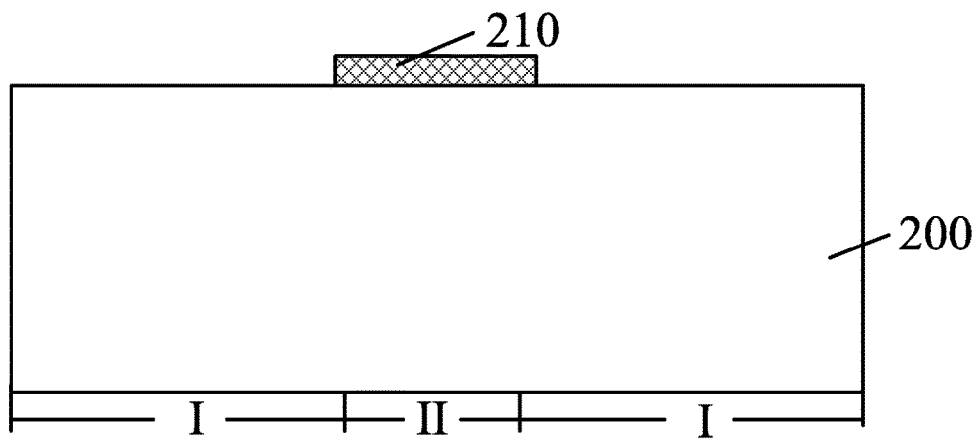
FIGS. 6-13 illustrate semiconductor structures corresponding to certain stages of a fabrication process of a semiconductor structure consistent with the disclosed embodiments.

As shown in FIG. 15, at the beginning of the fabrication process, a bottom substrate with certain structures may be formed (S101). FIG. 6 illustrates a corresponding semiconductor structure.

As shown in FIG. 6, a bottom substrate 200 may be provided, and a first mask layer 210 may be formed on the bottom substrate 200. The bottom substrate 200 may be single crystal material, and may have a first region I and a second region II. The bottom substrate 200 may be configured to subsequently form a semiconductor device. In one embodiment, the bottom substrate 200 may be single-crystal silicon. In certain other embodiments, the bottom substrate 200 may be a germanium substrate, a silicon germanium substrate, or other semiconductor substrates.

Figure 7:
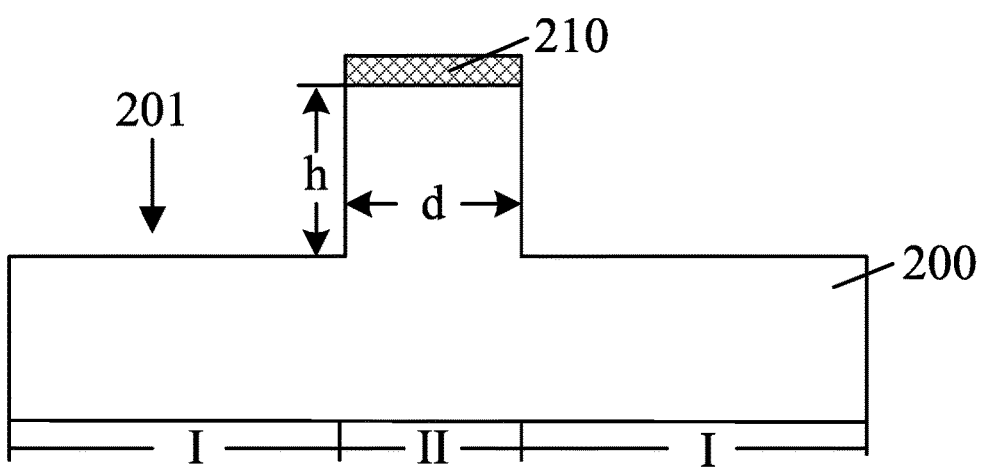

As shown in FIG. 15, after forming the bottom substrate, a trench may be formed (S102). FIG. 7 illustrates a corresponding semiconductor structure.

As shown in FIG. 7, a trench 201 in the first region I may be formed by patterning the bottom substrate 200, such that the surface of the bottom substrate 200 in the first region I may be lower than the surface of the bottom substrate 200 in the second region II. The bottom substrate 200 in the first region I may be configured to form a semiconductor device. The bottom substrate 200 in the second region II may be configured as a seed crystal for growing a top substrate in a subsequent process of forming the top substrate.

In one embodiment, referring to FIG. 6 and FIG. 7, patterning the bottom substrate 200 may include forming the patterned first mask layer 210 on the bottom substrate 200, where the first mask layer 210 may cover the bottom substrate 200 in the second region II and expose the bottom substrate 200 in the first region I. The first mask layer 210 may be configured to define the position and dimensions of the first region I and the second region II.

Patterning the bottom substrate 200 may also include using the first mask layer 210 as a mask, an etching process may be performed onto the bottom substrate 200 to form the trench 201. The trench 201 may be configured to accommodate subsequently formed insulation layer and top substrate.

In one embodiment, the first mask layer 210 may be made of silicon nitride. In certain other embodiments, the first mask layer 210 may be a hard mask layer formed by a deposition process and may be made of silicon oxide, silicon nitride, or silicon oxynitride, etc.

In one embodiment, the bottom substrate 200 may have the first region I at both sides of the second region II. The trench 210 may be formed in the bottom substrate 200 at both sides of the second region II.

In one embodiment, the bottom substrate 200 in the second region II may have a width 'd', and the trench 201 may have a depth 'h'. The width 'd' is the distance between the adjacent side walls of the trench 201; and the depth 'h' is the distance between the top of the bottom substrate 200 in the second region II and the bottom of the trench 201.

If the width 'd' of the bottom substrate 200 in the second region II is too small, it may be hard to provide the high quality seed crystal for the subsequent growth of the top substrate. If the width 'd' of the bottom substrate 200 in the second region II is too large, it may be easy to reduce the integration degree of the semiconductor structure. In one embodiment, the width 'd' of the bottom substrate 200 in the second region II may be in a range of approximately 5 nm-5 um.

In one embodiment, a dry etching process may be performed to etch the bottom substrate 200. The dry etching process may be an anisotropic etching method, which may have a desired profile control to control the line width of the first region I and the second region II. In certain other embodiments, a wet etching process may also be performed to etch the bottom substrate 200.

If the depth 'h' of the trench 201 is too small, it may be easy to cause the height of subsequent formed fin portion to be too small, thus affecting the performance of the semiconductor structure. If the depth 'h' of the trench 201 is too large, it may be difficult for the subsequent processes. In one embodiment, the depth of the trench 201 may be in a range of approximately 50-300 nm.

Figure 9:
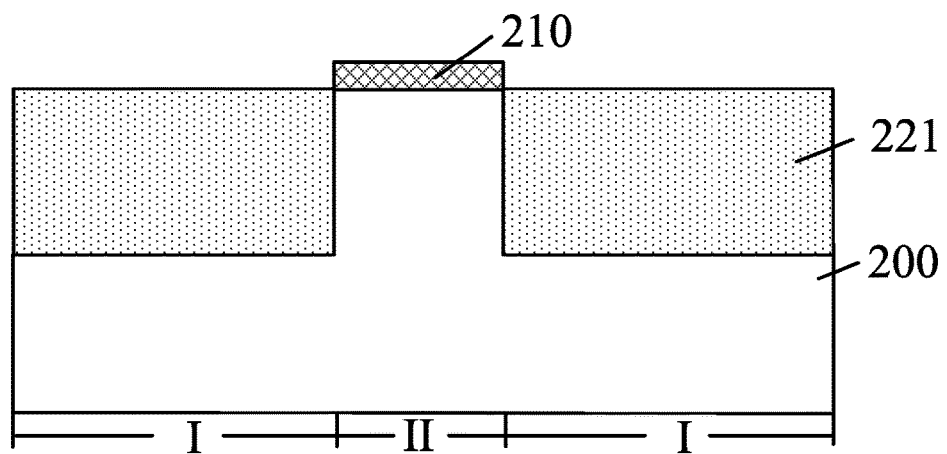
Figure 10:
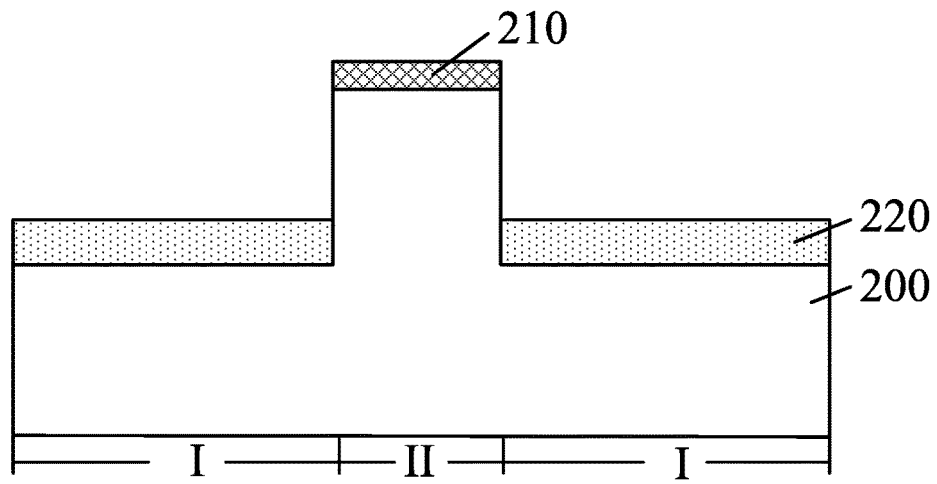

An insulation layer may be subsequently formed in the trench 201 in the first region I, and the insulation layer may expose part of surface of the bottom substrate 200 in the side wall of the trench 201. The insulation layer may be configured to achieve electrical insulation between the subsequently formed adjacent fins and between the fin portion and the bottom substrate 200, reducing the leakage current. In one embodiment, a process of forming the insulation layer is shown in FIGS. 8-10.

Returning to FIG. 15, after forming the trench in the first region, an initial insulation layer may be formed (S103). FIG. 8 illustrates a corresponding semiconductor structure.

Figure 8:
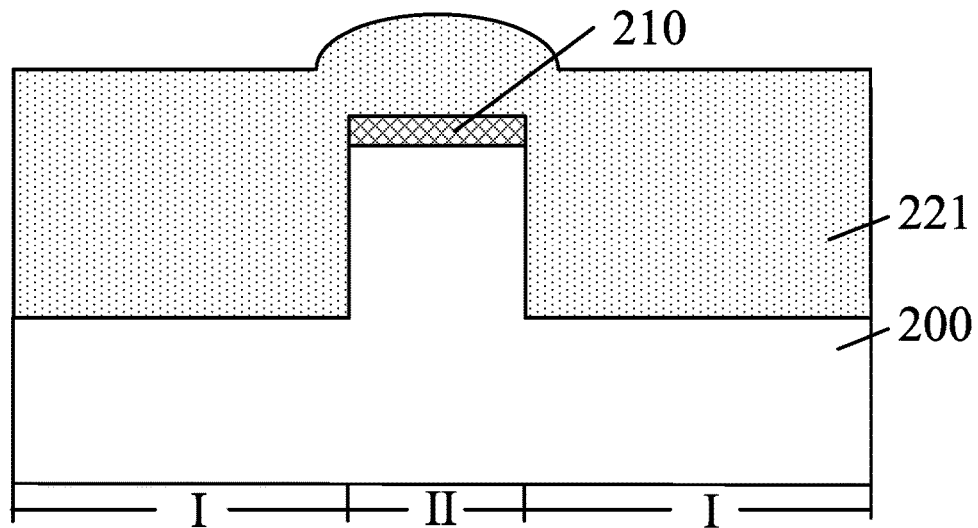

As shown in FIG. 8, an initial insulation layer 221 may be formed on the bottom substrate 200 and the first mask layer 210.

In one embodiment, the initial insulation layer 221 and the first mask layer 210 may be made of different materials. The initial insulation layer 221 may be made of different material from the first mask layer 210, such that the first mask layer 210 may be hard to be etched when etching the initial insulation layer 221, protecting the bottom substrate 200 in the second region II when forming the top substrate. The material of the initial insulation layer can also be the same material as the first mask layer 210.

Specifically, in one embodiment, the initial insulation layer 221 may be made of silicon oxide. There may be a desired adhesion between silicon oxide and the bottom substrate 200. In certain other embodiments, the initial insulation layer 221 may also be made of silicon nitride, or silicon oxynitride, etc.

In one embodiment, a chemical vapor deposition process may be performed to form the initial insulation layer 221. The chemical vapor deposition process may be simple, and the density and the uniformity of the formed initial insulation layer 221 may be desired. In certain other embodiments, the initial insulation layer 221 may also be formed by a physical deposition process, or an atomic layer deposition process, etc.

Returning to FIG. 15, after forming the initial insulation layer (e.g., gap fill the trench using dielectric layer), a planarization process may be performed onto the initial insulation layer (S104). FIG. 9 illustrates a corresponding semiconductor structure.

As shown in FIG. 9, a planarization process may be performed onto the initial insulation layer 221. The planarization process can improve the surface smoothness of the initial insulation layer 221, and reduce the scattering effect of the etching surface to the etching gas, thus increasing the surface smoothness of the initial insulation layer 221.

In one embodiment, a chemical mechanical polishing process may be performed to planarize the initial insulation layer 221.

Returning to FIG. 15, after planarizing the initial insulation layer, an insulation layer may be formed (S105). FIG. 10 illustrates a corresponding semiconductor structure.

As shown in FIG. 10, an insulation layer 220 may be formed by etching the initial insulation layer 221 until part of side wall of the bottom substrate 200 in the second region II is exposed. That is, a recess process may be performed on the initial insulation layer 221, while the remaining hard mask layer 210 may be not recessed.

In one embodiment, the insulation layer 220 may be formed by etching the initial insulation layer 221. The initial insulation layer 221 may be made of silicon oxide. Correspondingly, the insulation layer 220 may also be made of silicon oxide.

In one embodiment, if the thickness of the insulation layer 220 is too small, it may be difficult to achieve electrical isolation between the subsequently formed first fin portion and the bottom substrate 200. If the thickness of the insulation layer 220 is too large, it is easy to reduce the integration degree of the semiconductor structure. In one embodiment, the thickness of the insulation layer 220 may be in a range of approximately 5-200 nm.

In one embodiment, a dry etching process may be performed to form the insulation layer 220, such that the surface of the insulation layer 220 may be lower than the surface of the bottom substrate 200 in the second region II. The dry etching process may have desired profile control and line width control to control the line width of the bottom substrate 200 in the second region II. In certain other embodiments, a wet etching process may also be performed to etch the initial insulation layer 221.

Figure 11:
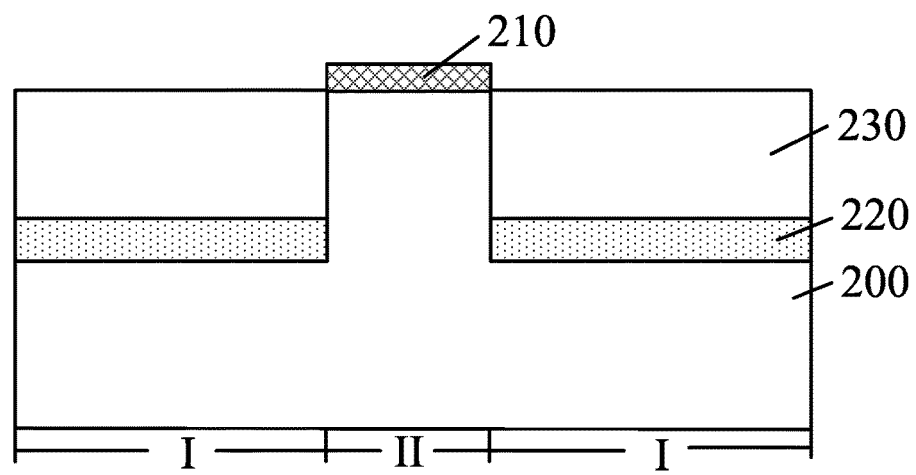

Returning to FIG. 15, after forming the insulation layer, a top substrate may be formed (S106). FIG. 11 illustrates a corresponding semiconductor structure.

As shown in FIG. 11, a top substrate 230 may be formed on the bottom substrate 200 in the exposed side wall of the trench 201 and the insulation layer 220 by an epitaxial growth process. The top substrate 230 may be configured to form a first fin portion in the subsequent process.

In one embodiment, the top substrate 230 may be made of a single crystal material. The single crystal material has desired electrical conductivity, and has small carrier impedance after subsequently forming a channel.

In addition, in one embodiment, the top substrate 230 may be made of the same material as the bottom substrate 200, such that the first fin portion and second fin portion can be subsequently formed in the same etching process, thus simplifying the process flow. At the same time, the line width and height of the first fin portion can be easily controlled by measuring the line width and height of the second fin portion. Specifically, in one embodiment, the top substrate 230 may be made of single-crystal silicon.

Further, in one embodiment, the bottom substrate 200 may be made of single-crystal silicon. During the process of forming the insulation layer 220, the insulation layer 220 may expose part of side wall of the bottom substrate 200 in the second region II. Therefore, during the process of forming the top substrate 230 also made of single-crystal silicon, part of side wall of the bottom substrate 200 in the second region II may be configured as the seed crystal for growing the top substrate 230, thus reducing the process difficulty.

Therefore, in one embodiment, a selective epitaxial growth process may be performed to form the top substrate 230. That is, the epitaxial layer may not be nucleated and grown on the insulation layer 220, and may be just grown on the side wall of the bottom substrate 200 in the second region II exposed by the insulation layer 220. Then, the epitaxial layer may be laterally extended to cover the entire insulation layer 220. The selective epitaxial growth process can form high-quality single crystal, such that the top substrate 230 may have desired electrical properties.

During the selective epitaxial growth process, by adjusting the ratio of growing gas and etching gas, or by adjusting the growth temperature and growth pressure, the silicon epitaxial layer can only be grown on the silicon substrate, and not be grown on the dielectric layer, such as silicon oxide, or silicon nitride, etc. In one embodiment, by adjusting the ratio of the growing gas and the etching gas, or by adjusting the growth temperature and the growth pressure, the top substrate 230 may only be grown on side wall of the bottom substrate 200 in the second region II exposed by the insulation layer 220. Specifically, with respect to the parameters of the epitaxial growth process, the growing gases may be $SiH_4$, $SiHCl_3$, $SiH_2Cl_2$, $SiH_3Cl$, $SiCl_4$, and $H_2$; the etching gas may be HF, or HCl; the growth temperature may be in a range of approximately 800-1300° C.; and the growth pressure may be in a range of approximately 10-760 Torr.

That is, the selective epitaxial growth process may also be called a laterally selective epitaxial growth process. The laterally epitaxial growth process may be performed to form an epitaxial layer on the dielectric layer. The exposed side surface of the trench after the recess process may be configured as a growth starting surface to perform the selective epitaxial growth process until the epitaxial layer covers the entire dielectric layer. The epitaxial layer may not be grown on the hard mask layer and the dielectric layer without the interface of single-crystal silicon. If the surface of the formed epitaxial layer is rough, a chemical mechanical polishing process may be performed to planarize the epitaxial layer.

After forming the top substrate 230, the first mask layer 210 may be removed. That is, during the process of forming the top substrate 230, the first mask layer 210 may cover the top surface of bottom substrate 200 in the second region II. Therefore, the top substrate 230 may be hard to be grown on the second region II, such that the heights of the subsequently formed first fin portion and second fin portion may be the same, achieving a height control of the first fin portion.

Therefore, in one embodiment, the top surface of the top substrate 230 formed by the epitaxial growth process may be level with the top surface of the bottom substrate 200 in the second region II. Specifically, the thickness of the top substrate 230 may be in a range of approximately 45-100 nm.

Figure 12:
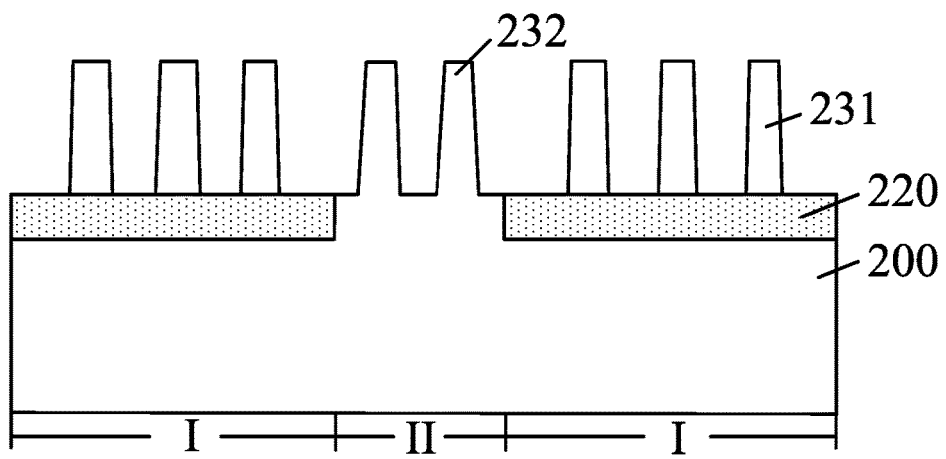

Returning to FIG. 15, after forming the top substrate, a first fin portion may be formed in the first region (S107). FIG. 12 illustrates a corresponding semiconductor structure.

As shown in FIG. 12, a first fin portion 231 may be formed in the first region I by etching the top substrate 230 in the first region I until the insulation layer 220 is exposed. The first fin portion 231 may include one or more fins, and may be configured for subsequently forming a transistor channel.

In one embodiment, to control and detect the height and line width of the first fin portion 231, during the process of etching the top substrate 230 in the first region I, etching the bottom substrate 200 in the second region II to form a second fin portion 232. The second fin portion 232 may include one or more fins and may be configured for testing in the testing process, such that the height and line width of the first fin portion 231 can be controlled. Thus, the one or more fins of the second fin portion 232 may also be called dummy fins.

In one embodiment, the bottom substrate 200 and the top substrate 230 may be made of single-crystal silicon. Correspondingly, the first fin portion 231 and the second fin portion 232 may also be made of single-crystal silicon. Single-crystal silicon has excellent electrical properties, and has small impedance after forming the channel. Therefore, the formed semiconductor structure may have excellent performance.

In one embodiment, the process of forming the first fin portion 231 and the second fin portion 232 may include: forming a patterned second mask on the top substrate 230 in the first region I and on the bottom substrate 200 in the second region II (not labeled); and using the second mask as a mask to etch the top substrate 230 in the first region I and the bottom substrate 200 in the second region II to form the first fin portion 231 in the first region I and the second fin portion 232 in the second region II.

In one embodiment, a dry etching process may be performed to etch the top substrate 230 in the first region I and the bottom substrate 200 in the second region II. The dry etching process may be an anisotropic etching method, have an excellent profile control, and easily control the line widths and heights of the first fin portion 231 and the second fin portion 232. Specifically, in one embodiment, the etching gas of etching the top substrate 230 in the first region I and the bottom substrate 200 in the second region II may be $CF_4$, or $CCl_4$, etc.

If the dimensions of the first fin portion 231 and the second fin portion 232 are too small, it may be easy to produce a short-channel effect in the transistor. If the dimensions of the first fin portion 231 and the second fin portion 232 are too large, it may be easy to reduce the integration degree of the transistor. In one embodiment, the line widths of the first fin portion 231 and the second fin portion 232 may be in a range of approximately 5-15 nm. The heights of the first fin portion 231 and the second fin portion 232 may be in a range of approximately 20-80 nm.

Further, in one embodiment, before etching the top substrate 230 in the first region I and the bottom substrate 200 in the second region II, the method may also include forming a relatively flat etching surface by planarizing the top substrate 230. Specifically, a chemical mechanical polishing process may be performed to planarize the top substrate 230.

Figure 13:
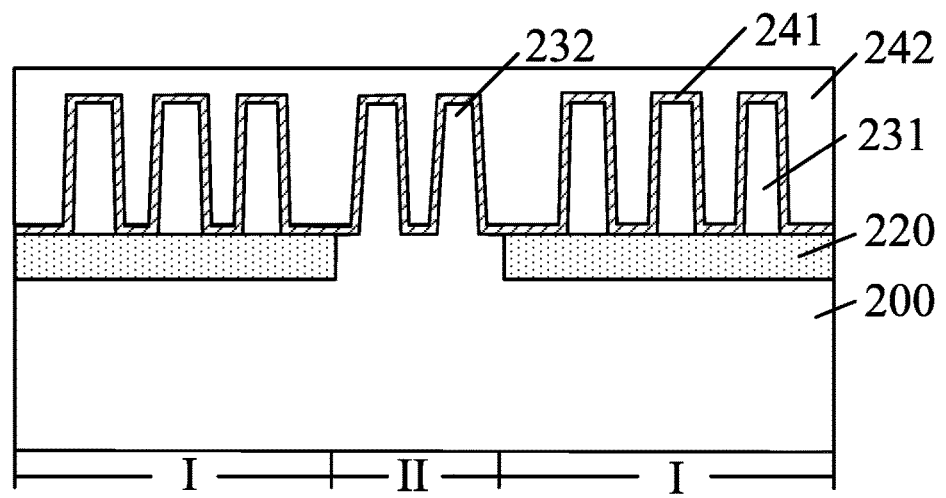

Returning to FIG. 15, after forming the first fin portion, a gate structure may be formed (S108). FIG. 13 illustrates a corresponding semiconductor structure.

As shown in FIG. 13, a gate structure crossing the first fin portion 231 may be formed. The gate structure may cover part of top and side surfaces of the first fin portion 231. The gate structure may be configured as a transistor gate, and the first fin portion 231 under the gate structure may constitute the transistor channel.

In one embodiment, the second fin portion 232 may be formed in the second region II. Therefore, during the process of forming the gate structure, the gate structure may also cross the second fin portion 232. In one embodiment, the gate structure may include a gate dielectric layer 241 crossing the first fin portion 231 and the second fin portion 232, and a gate layer 242 covering the gate dielectric layer 241.

Specifically, in one embodiment, the gate dielectric layer 241 may be made of high-K dielectric materials, such as TiN, or TaN, etc. The gate layer 242 may be made of titanium aluminum alloy, or tungsten, etc. In certain other embodiments, the gate dielectric layer 241 may also be made of silicon oxide, and the gate layer 242 may also be made of polysilicon.

After forming the gate structure, the method may also include doping the first fin portion 231 at both sides of the gate structure to form a source region and a drain region in the first region I.

Accordingly, during the fabrication process of a semiconductor structure consistent with the disclosed embodiments, the insulation layer may be formed in the trench. The insulation layer can achieve electrical insulation between the first fin portion and the bottom substrate, and reduce the diffusion of carriers in the first fin portion to the bottom substrate, thus reducing the leakage current at the bottom of the first fin portion. In addition, during the fabrication process, the bottom substrate may be single-crystal silicon. Before forming the top substrate, the insulation layer may expose part of the bottom substrate in the side wall of the trench. Therefore, during the process of forming the top substrate, the bottom substrate in the exposed side wall of the trench can provide the seed crystal for forming the top substrate, thus it may be relatively easy to form the top substrate by the epitaxial growth process, and the process difficulty may be relatively low.

Further, during the process of etching the top substrate in the first region, etching the bottom substrate in the second region to form the second fin portion. The second fin portion can be configured for testing in the testing process, such that the height and line width of the first fin portion can be controlled.

In addition, after forming the top substrate, the first mask layer may be removed. That is, during the process of forming the top substrate, the first mask layer may cover the top surface of bottom substrate in the second region II. Therefore, the top substrate may be hard to be grown on the second region II, such that the heights of the subsequently formed first fin portion and second fin portion may be the same, achieving a height control of the first fin portion.

Figure 14:
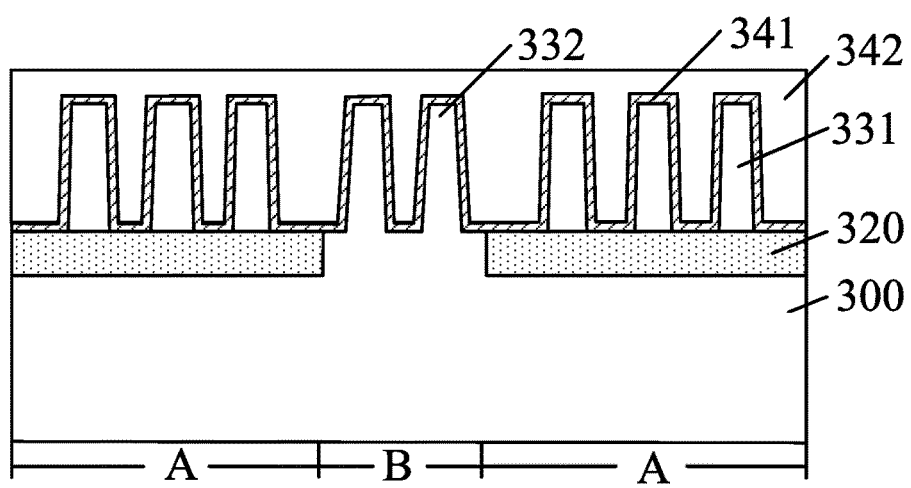
FIG. 14 illustrates a semiconductor structure consistent with the disclosed embodiments.

Correspondingly, a semiconductor structures is also provided in the present invention. FIG. 14 illustrates an exemplary semiconductor structure.

As shown in FIG. 14, the semiconductor structure may include a substrate 300. The substrate 300 may be single crystal material, and may have a first region A and a second region B contacted with the first region A. The surface of the substrate 300 in the first region A may be lower than the surface of the substrate 300 in the second region B. The semiconductor structure may also include an insulation layer 320 formed on the substrate 300 in the first region A, and a first fin portion 331 formed on the insulation layer 320. Further, the semiconductor structure may include a gate structure crossing the first fin portion 331, where the gate structure may cover part of side and top surfaces of the first fin portion 331.

The first region A may be configured to subsequently form a semiconductor device; and the second region B may be configured as a seed crystal for forming the first fin portion 331. In one embodiment, the first region A may be formed in the substrate 300 at both sides of the second region B. Therefore, the substrate 300 in the second region B may have a width, and the width is the distance between the adjacent side walls of the insulation layer 320 at both sides of the second region B.

If the width of the substrate 300 in the second region B is too small, it may be hard to provide the high quality seed crystal. If the width of the substrate 300 in the second region B is too large, it may be easy to reduce the integration degree of the semiconductor structure. In one embodiment, the width of the substrate 300 in the second region B may be in a range of approximately 5 nm-5 um.

In one embodiment, the substrate 300 may be made of a single crystal material, and the single crystal material has desired electrical conductivity. Specifically, the substrate 300 may be made of single-crystal silicon. In certain other embodiments, the substrate 300 may be a germanium substrate, a silicon germanium substrate, or other semiconductor substrates.

In one embodiment, the insulation layer 320 may be made of silicon oxide. There may be a desired adhesion between silicon oxide and the substrate 300. In certain other embodiments, the insulation layer 320 may also be made of silicon nitride, or silicon oxynitride, etc.

In one embodiment, if the thickness of the insulation layer 320 is too small, it may be difficult to achieve electrical isolation between the first fin portion and the substrate 300. If the thickness of the insulation layer 320 is too large, it may be easy to waste materials. In one embodiment, the thickness of the insulation layer 320 may be in a range of approximately 5-200 nm.

The first fin portion 331 may be formed on the insulation layer 320 in the first region A, and may be configured to subsequently form a transistor channel. In one embodiment, the semiconductor structure may also include a second fin portion 332 formed on the substrate 300 in the second region B. The second fin portion 332 may be configured for detecting, such that the height and line width of the first fin portion 331 can be controlled.

In one embodiment, the first fin portion 331 and the second fin portion 332 may also be made of single-crystal silicon. Single-crystal silicon has excellent electrical properties, and has small impedance after forming the channel. Therefore, the formed semiconductor structure may have excellent performance.

If the dimensions of the first fin portion 331 and the second fin portion 332 are too small, it may be easy to produce a short channel-effect in the transistor. If the dimensions of the first fin portion 331 and the second fin portion 332 are too large, it may be easy to reduce the integration degree of the transistor. In one embodiment, the line widths of the first fin portion 331 and the second fin portion 332 may be in a range of approximately 5-15 nm. The heights of the first fin portion 331 and the second fin portion 332 may be in a range of approximately 20-80 nm.

The gate structure crossing the first fin portion 331 may be formed. The gate structure may cover part of top and side surfaces of the first fin portion 331. In one embodiment, the semiconductor structure may also include the second fin portion 332. Therefore, the gate structure may also cover part of top and side surfaces of the second fin portion 332. In one embodiment, the gate structure may include a gate dielectric layer 341 crossing the first fin portion 331 and the second fin portion 332, and a gate layer 342 covering the gate dielectric layer 341.

Specifically, in one embodiment, the gate dielectric layer 341 may be made of high-K dielectric materials, such as TiN, or TaN, etc. The gate layer 342 may be made of titanium aluminum alloy, or tungsten, etc. In certain other embodiments, the gate dielectric layer 341 may also be made of silicon oxide, and the gate layer 342 may also be made of polysilicon.

The semiconductor structure may also include a source region and a drain region at both sides of the gate structure in the first region A.

Accordingly, in the semiconductor structure consistent with the disclosed embodiments, the insulation layer may be formed under the first fin portion. The insulation layer can achieve electrical insulation between the first fin portion and the substrate, thus reducing the leakage current at the bottom of the first fin portion.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a bottom substrate having a first region and a second region;
   an insulation layer formed on the bottom substrate in the first region;
   a first fin portion formed over the insulation layer, the first fin portion being formed by etching a top substrate, the top substrate being formed directly on the top of the insulation layer and the side of the bottom substrate in the second region, and the top substrate being formed by a selective epitaxial growth process on a sidewall of the bottom substrate exposed in the second region by the insulation layer, wherein:
      the first fin portion is electrically isolated from the bottom substrate through the insulation layer to reduce the leakage current at the bottom of the first fin portion, and
      the first fin portion includes a plurality of first fins, each of the plurality of first fins is isolated from adjacent first fins by the insulation layer;
   a second fin portion formed on the substrate in the second region by etching the bottom substrate exposed in the second region by the insulation layer; and
   a gate structure crossing the first fin portion and the second fin portion, wherein the gate structure covers part of side and top surfaces of the first fin portion.

2. The semiconductor structure according to claim 1, wherein:
   the insulation layer is made of silicon oxide, silicon nitride, or silicon oxynitride; and
   a thickness of the insulation layer is in a range of approximately 5-200 nm.

3. The semiconductor structure according to claim 1, further including:
   a source region and a drain region formed in the first fin portion at both sides of the gate structure.

4. The semiconductor structure according to claim 1, wherein:
   a width of the bottom substrate in the second region is in a range of approximately 5 nm-5 um.

5. The semiconductor structure according to claim 1, wherein:
   a height of the first fin portion is in a range of approximately 45-100 nm.

6. The semiconductor structure according to claim 1, wherein:
   line widths of the first fin portion and the second fin portion are in a range of approximately 5-15 nm.

7. The semiconductor structure according to claim 1, wherein:

heights of the first fin portion and the second fin portion are in a range of approximately 20-80 nm.

8. The semiconductor structure according to claim 1, wherein:
the second region is contact with the first region.

9. The semiconductor structure according to claim 1, wherein:
the first fin portion and the bottom substrate are made of a same material including single-crystal silicon.

10. The semiconductor structure according to claim 1, wherein:
a depth of the insulation layer is in a range of approximately 50-300 nm.

11. The semiconductor structure according to claim 1, wherein:
a height of the first fin portion is in a range of approximately 45-100 nm.

12. The semiconductor structure according to claim 1, wherein:
a top surface of the insulation layer is lower than a top surface of the second fin portion.

* * * * *